(12) United States Patent
Zhu et al.

(10) Patent No.: US 7,855,128 B2
(45) Date of Patent: Dec. 21, 2010

(54) BACK-ILLUMINATED IMAGER USING ULTRA-THIN SILICON ON INSULATOR SUBSTRATES

(75) Inventors: Rui Zhu, East Brunswick, NJ (US); Peter Alan Levine, West Windsor, NJ (US); Pradyumna Kumar Swain, Gaithersburg, MD (US); Mahalingam Bhaskaran, Lawrenceville, NJ (US)

(73) Assignee: Sarnoff Corporation, Princeton, NJ (US)

( * ) Notice: Subject to any disclaimer, the term of this patent is extended or adjusted under 35 U.S.C. 154(b) by 0 days.

(21) Appl. No.: 12/472,722

(22) Filed: May 27, 2009

(65) Prior Publication Data

US 2009/0298260 A1 Dec. 3, 2009

Related U.S. Application Data

(60) Provisional application No. 61/056,641, filed on May 28, 2008.

(51) Int. Cl.
*H01L 21/302* (2006.01)

(52) U.S. Cl. ............................. 438/458; 257/E21.568; 438/464

(58) Field of Classification Search ................ 438/113, 438/455–465
See application file for complete search history.

(56) References Cited

U.S. PATENT DOCUMENTS

| | | | |
|---|---|---|---|
| 4,219,829 A | 8/1980 | Dorda et al. | |
| 6,245,645 B1 | 6/2001 | Mitani et al. | |
| 7,238,583 B2 | 7/2007 | Swain et al. | |
| 2005/0208694 A1* | 9/2005 | Yue et al. | 438/31 |
| 2007/0155183 A1 | 7/2007 | Ottaviani et al. | |
| 2007/0161219 A1* | 7/2007 | Giles | 438/530 |
| 2008/0290425 A1* | 11/2008 | Giles et al. | 257/408 |

OTHER PUBLICATIONS

International Search Report of PCT/US2009/45294 dated Jul. 21, 2009.

* cited by examiner

*Primary Examiner*—Savitri Mulpuri
(74) *Attorney, Agent, or Firm*—Lowenstein Sandler PC (57) ABSTRACT

A method for fabricating a back-illuminated semiconductor imaging device on an ultra-thin semiconductor-on-insulator substrate (UTSOI) is disclosed. The UTSOI substrate is formed by providing a handle wafer comprising a mechanical substrate and an insulator layer substantially overlying the mechanical substrate. A donor wafer is provided. Hydrogen is implanted in the donor wafer to form a bubble layer. The donor wafer is doped with at least one dopant to form a doped layer proximal to the bubble layer. The handle wafer and the donor wafer are bonded between the insulator layer of the handle wafer and a surface of the donor wafer proximal to the doped layer to form a combined wafer having a portion substantially underlying the bubble layer. The portion of the combined wafer substantially underlying the bubble layer is removed so as to expose a seed layer. An epitaxial layer is grown substantially overlying the seed layer, wherein at least one dopant diffuse into the epitaxial layer. At the completion of the growing of the epitaxial layer, there exists a net dopant concentration in the seed layer and the epitaxial layer which has maximum value at or near an interface between the seed layer and the insulator layer.

16 Claims, 8 Drawing Sheets

BACK-ILLUMINATED IMAGER USING ULTRA-THIN SILICON ON INSULATOR SUBSTRATES

CROSS-REFERENCE TO RELATED APPLICATIONS

This application claims the benefit of U.S. provisional patent application No. 61/056,641 filed May 28, 2008, the disclosure of which is incorporated herein by reference in its entirety.

FIELD OF THE INVENTION

The field of invention is semiconductor device fabrication and device structure. More specifically, the field is fabrication and structure of back-illuminated semiconductor imaging devices that employ ultra-thin silicon on insulator (UTSOI) substrates using the "Smart Cut" method.

BACKGROUND OF THE INVENTION

Thinned, back-illuminated, semiconductor imaging devices are advantageous over front-illuminated imagers for high fill factor and better overall efficiency of charge carrier generation and collection. A goal of the operation of such devices is for the charge carriers generated by light or other emanation incident on the backside to be driven to the front side quickly to avoid any horizontal drift, which may smear the image. It is also desirable to minimize the recombination of the generated carriers before they reach the front side, since such recombination reduces overall efficiency and sensitivity of the device.

Such desirable features may be achieved by providing a thin semiconductor layer and a high electric field within this layer. The field should extend to the back surface, so that the generated carriers, such as electrons or holes, can be driven quickly to the front side. U.S. Pat. No. 7,238,583 by Swain et. al. (the "'583 patent"), which is incorporated herein by reference in its entirety, describes a method for producing a back-illuminated imaging device that exhibits the desired internal electric field. The device of the '583 patent also employs ultra thin Silicon-on-Insulator (UTSOI) technology for providing a semiconductor substrate on which the back-illuminated imager is constructed. The practical work flow for using the method described in the '583 patent is shown in FIG. 1.

Figure 1:
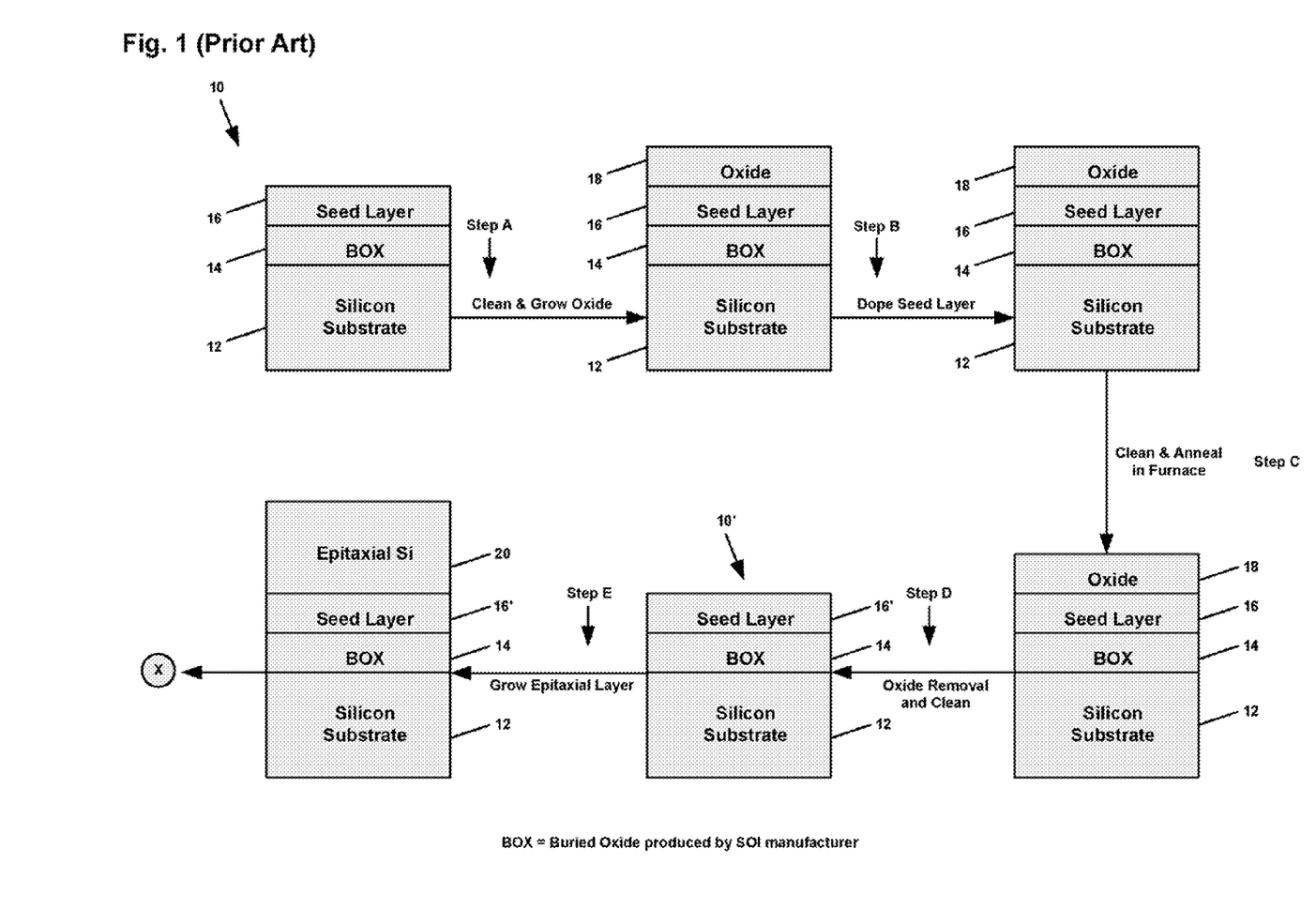
FIG. 1 shows a process for fabricating a back-illuminated imaging device on a UTSOI substrate in accordance with the '583 patent.

In FIG. 1, the starting structure is an initial substrate 10, sometimes referred to in the art as a UTSOI substrate. The starting UTSOI substrate 10, is composed of a mechanical substrate 12 (handle wafer) configured to provide mechanical support during processing, an insulator layer 14 (which can be, for example, a buried oxide layer of silicon (BOX)), and a semiconductor substrate 16 (also referred to as the "seed layer"). The mechanical substrate 12 may be composed of any suitable semiconductor material, such as, for example, silicon. The seed layer 16 is typically 1000-2000 Å in thickness but may fall outside this range.

In Step A, the UTSOI wafer 10 is cleaned and an oxide layer 18 is grown overlying the seed layer 16 opposite the mechanical substrate 12. In Step B, the seed layer 16 is doped. Dopants are introduced into the seed layer 16 in sufficient concentration to produce a desired net doping profile. The initial net doping concentration in the seed layer 16 may be on the order of $10^{17}$ charge carriers per cubic centimeter or higher, and may be either p-type or n-type. Common dopants include boron, phosphorous, antimony, and arsenic.

In the specific case where the semiconductor is silicon, the '583 patent cites boron as the most suitable dopant for producing p-type regions. In this example, the boron dopant is incorporated within the seed layer 16 before the growth of the epitaxial layer. Although the '583 patent outlines several techniques for introducing the boron dopant, the preferred method for introduction of p-type dopants is through the use of ion-implantation. With reference to this example, in Step B, ions of boron are implanted ballistically through the oxide layer 18 into the seed layer 16 of UTSOI wafer 10.

In Step C, the UTSOI wafer 10 is cleaned and annealed in a furnace to remove the damage introduced by the ion implantation of dopants, i.e., broken bonds are reformed and dopants are incorporated at lattice sites. In Step D, the oxide layer 18 is removed and the resulting doped wafer 10' is cleaned. In Step E, an epitaxial layer 20 is grown overlying the doped seed layer 16', using the seed layer 16 as the template. The epitaxial layer 20 provides a layer for fabricating front side components which complete the overall imaging device. Still referring to FIG. 1, during the growth of epitaxial layer 20, dopants previously introduced into the seed layer 16 diffuse into the epitaxial layer 20 as a result of processing at or above 1000° C. At the conclusion of the growth of the epitaxial layer 20, the net doping profile is very close to the desired profile, in that at each distance from an interface 22 between the insulator layer 14 and the seed layer 16, within the seed layer 16 and epitaxial layer 20, the net carrier concentration is close to its final desired value. All remaining steps in the process are then carried out at lower temperatures, so that relatively little diffusion of dopants takes place, and the profile is essentially unchanged at the end of the process.

In Step F, once the epitaxial layer 20 is grown, with the simultaneous formation of a desired dopant profile, one or more imaging components 24 may be fabricated using known methods of semiconductor fabrication. These imaging components may include charge-coupled device (CCD) components, CMOS imaging components, photodiodes, avalanche photodiodes, phototransistors, or other optoelectronic devices, in any combination. Imaging components 24 may include both CCD and CMOS components fabricated in separate areas of the epitaxial layer 20 using known masking methods. Also included may be other electronic components such as CMOS transistors, (not shown) bipolar transistors (not shown), capacitors (not shown), or resistors (not shown). One or more p-n junctions 26 of various depths may be formed during the fabrication of the imaging components 24.

In Step G, the mechanical substrate 12 is removed. Once the fabrication of components 24 is complete, the mechanical substrate 12 is no longer needed to provide mechanical stability. Removal of the mechanical substrate 12 may also be desirable in order to allow the emanation being detected to reach the backside semiconductor. Removal of the mechanical substrate 12 may be accomplished by such methods as chemical etching, mechanical grinding, or a combination of these methods. With chemical etching, the mechanical substrate 12 may be removed selectively, without removing the insulator layer 14.

After the mechanical substrate 12 is entirely removed, the insulator layer 14 may be removed, either partially or entirely, by chemical or physical methods or a combination of the two methods. In one embodiment, the insulator layer 14 is made to act as an anti-reflection coating for electromagnetic waves having wavelengths in a predetermined range, thereby allowing more photons to reach, and be absorbed in, the semiconductor layers 16, 20. This may be accomplished by reducing thickness of the insulator layer 14 to a thickness which minimizes reflection in the predetermined wavelength range. The thickness may be determined by the wavelength range and the index of refraction of the material of the insulator layer 14 in this wavelength range.

After partially removing the insulator layer 14, one or more anti-reflective coating layers (e.g., zirconium oxide or bismuth oxide) (not shown) can be deposited on the insulation layer 14 to function as an overall anti-reflective coating stack for a desired range of wavelengths. In still other embodiments, the insulation layer 14 can be completely etched away, and one or more anti-reflective coating layers can be deposited on the seed layer 16 so as to function as an overall antireflective coating.

Figure 2:
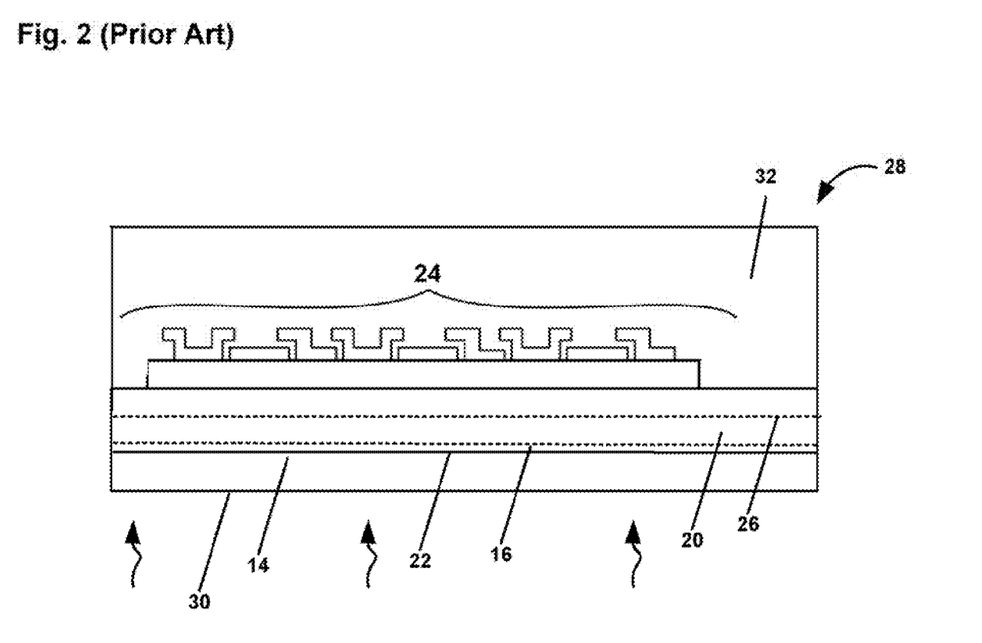
FIG. 2 shows a complete device structure and resulting executing the processing steps depicted in FIG. 1.

FIG. 2 shows a complete laminated imaging device 28 as described in the '583 patent, with an anti-reflection coating 30. For thin devices, a sufficiently rigid lamination layer 32 may be added to provide mechanical stability. In FIG. 2, the lamination layer 32 is shown on the front side of the imaging device 28. Lamination layer 32 may be bonded to the front side of the wafer with cement after concluding the fabrication of the imaging components 24 and other front-side components. Alternatively, the lamination layer may be bonded to the back of the imaging device 28. If the lamination layer 32 is bonded to the back of the imaging device 28, lamination layer material, any cement used to bond the lamination layer, and any other materials between the lamination layer 32 and the back of the device 28 must be transparent to, and not degraded by, detected radiation.

Referring again to FIG. 1, a goal of the process for manufacturing a back-illuminated imaging device described in the '583 patent is the creation of a final net dopant concentration profile in the seed layer 16 and the epitaxial layer 20 which has a maximum value at the interface 22 between the seed layer 16 and the insulator layer 14. The final net dopant concentration profile after the epitaxial growth (i.e., Step E) decreases monotonically with increasing distance from the interface 22 within a portion of the seed layer 16 and the epitaxial layer 20 between the interface 22 and the p-n junctions 26 shown in FIG. 1 (p-n junctions 26 are created during fabrication of the front-side components 24). Such a profile may give rise to an electric field within the seed layer 16 and the epitaxial layer 20 tending to drive photo-generated electrons toward the front side imaging components 24 and minimizing the trapping of these electrons near the backside.

Figure 3:
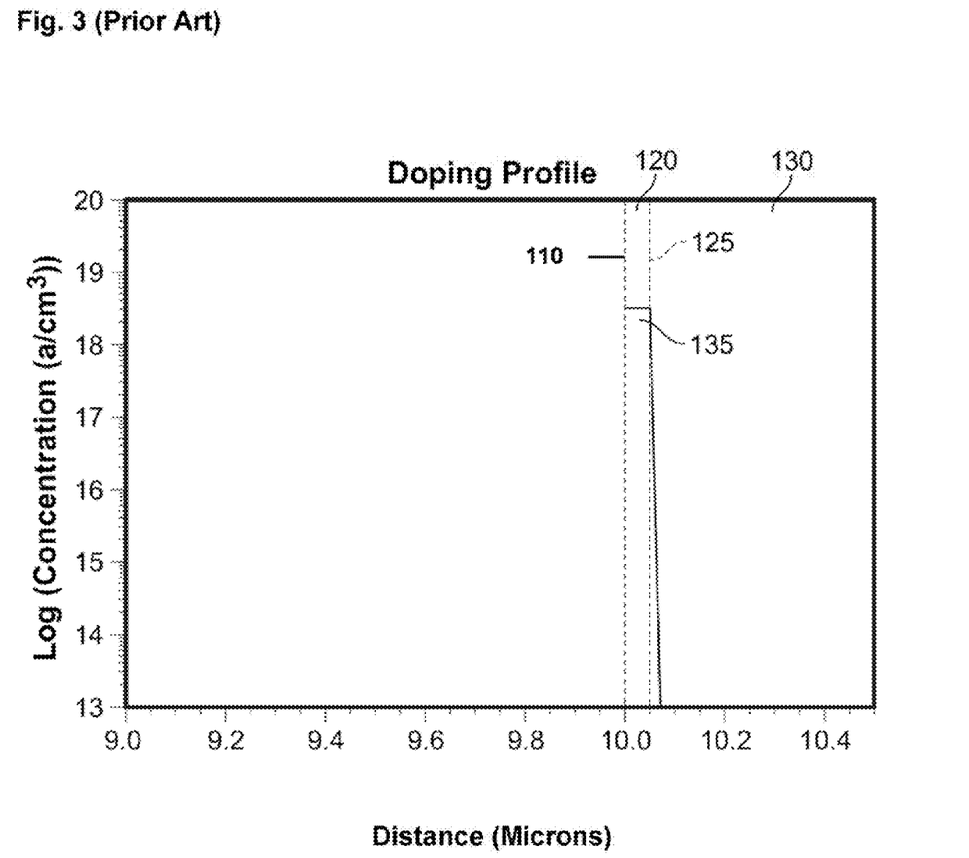
FIG. 3 shows an initial doping profile in a semiconductor substrate as described in the '583 patent.
Figure 4:
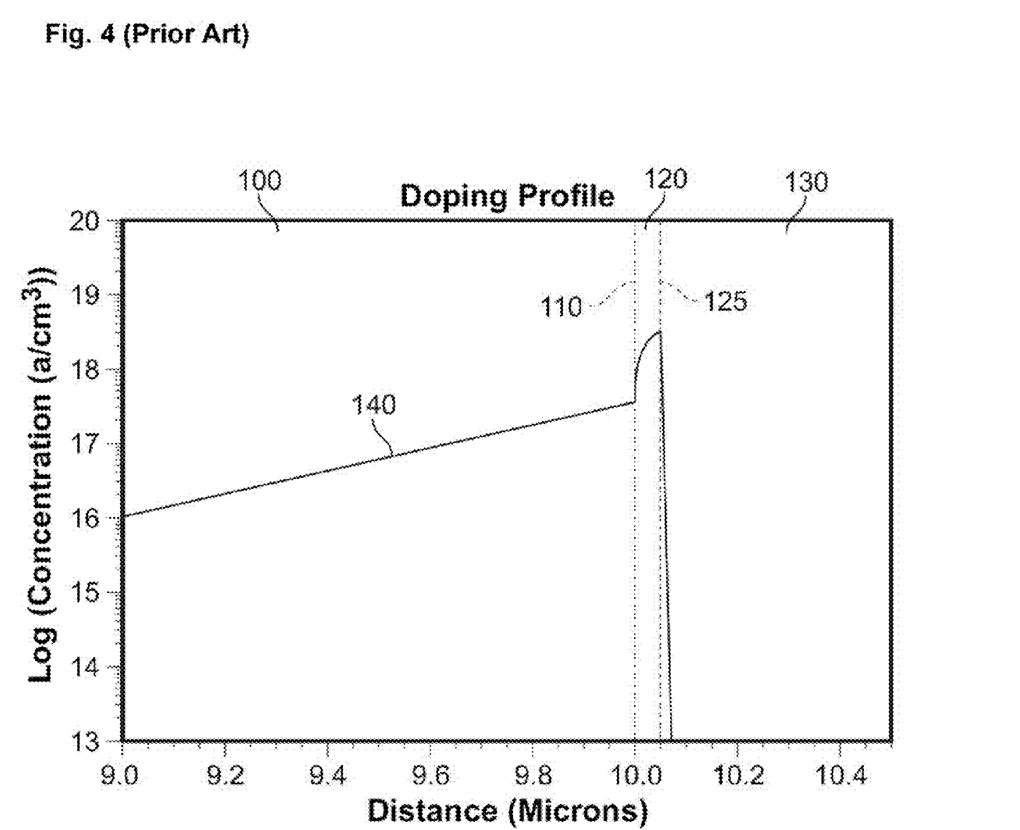
FIG. 4 shows a doping profile following growth of an epitaxial layer as described in the '583 patent.
Figure 5:
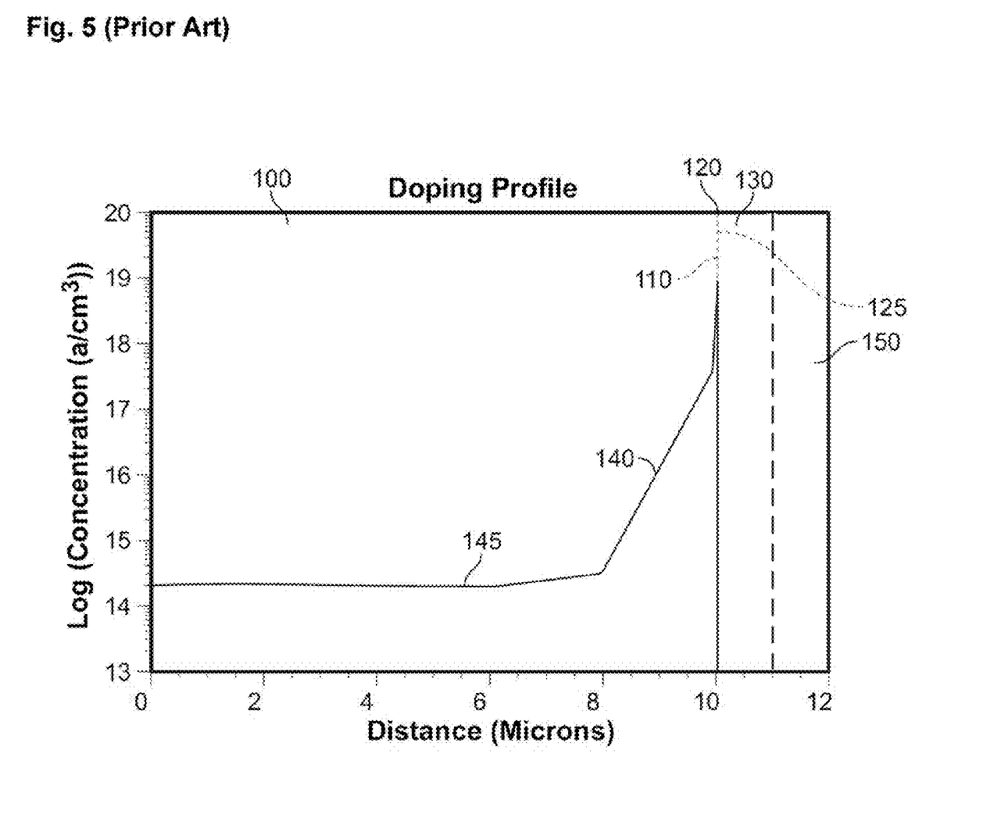
FIG. 5 shows the doping profile of FIG. 4 on a larger distance scale as described in the '583 patent.

Processing parameters such as doping levels, initial doping profiles, and temperatures are chosen to give the desired doping profile, as described above. FIGS. 3 through 5, reproduced from the '583 patent, show the results of computer simulations of desired net doping profiles. In these figures, various regions correspond to regions of the structures shown in FIG. 1, as follows:

Region 150 corresponds to the mechanical substrate 12; Region 130 corresponds to the insulator layer 14 comprising an oxide of silicon; Region 120 corresponds to the seed layer 16 comprising silicon; Region 100 corresponds to the epitaxial layer 20 comprising silicon; reference number 125 corresponds to the interface 22 between the seed layer 16 and the insulator layer 14; and reference number 110 corresponds to an interface between the seed layer 16 and the epitaxial layer 20.

FIG. 3 shows an initial doping profile 135 in seed layer 120, before growth of the epitaxial layer 100. Boron is used as the dopant, and it may be introduced into the seed layer 120 by any of the methods for introducing dopants described above. Initial profile 135 is created by boron doping (or, equivalently, net p-type doping) with a net p-type concentration of about $1 \times 10^{19}$ carriers per cubic centimeter, assumed uniform through the seed layer 120.

FIG. 4 shows a net final doping profile 140 after growth of the epitaxial layer 100. The net final doping profile 140 in this embodiment is p-type; alternatively it could be n-type. Boron atoms starting in the seed layer 120 diffuse into the epitaxial layer 100 during growth of that layer to produce the net doping profile 140, as discussed above. The net final doping profile 140 in this simulated process exhibits the following desirable features: it has a maximum value at the interface 125 between the seed layer 120 and the insulator layer 130 and decreases monotonically with increasing distance from the interface 125 within the seed layer 120 and the epitaxial layer 100. The net final doping profile 140 has a "dual" slope which decreases monotonically from the interface 125 at a first average rate, and decreases monotonically at a second average rate substantially in the region 140 that is slower than the first average rate substantially within the region 120 (i.e., the seed layer 120).

FIG. 5 shows the same doping profile as FIG. 4 on a larger scale of distance, in order to show essentially the entire profile. At some distance from the interface 125, the monotonically decreasing portion of the net final doping profile 140 meets the background doping level 145 in the epitaxial layer 100. The doping level remains at this concentration level 145 all the way to the junctions (not shown in FIG. 5). As long as net doping concentration 140, 145 does not increase with distance away from the interface 125, carriers generated in the seed layer 120 or the epitaxial layer 100 by waves or particles incident on the backside may tend to be driven toward the front imaging components (not shown) and not in the opposite direction.

One of the concerns expressed about high-resolution imaging devices made using technology that is similar to that disclosed in the '583 patent is the potential presence of dark current in the resulting imager. Dark current is the generation of carriers (electrons or holes), exhibited by a back-illuminated imager during periods when the imager is not actively being exposed to light. Dark current is detrimental to back-illuminated imager operation because excess dark current signal collected along with a desired optically generated signal results in higher levels of fixed pattern and excess random shot noise. The offset signal produced by dark current is seen as a non-uniform shading in a displayed image.

Figure 6:
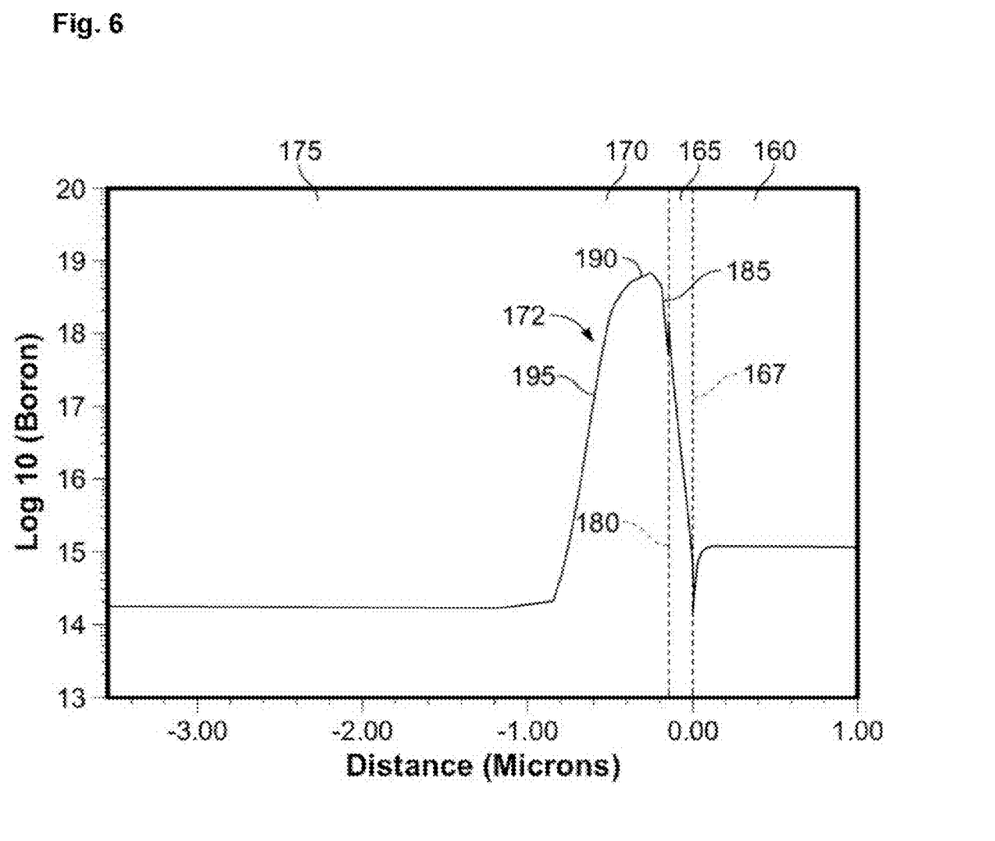
FIG. 6 shows a doping profile following the growth of an epitaxial layer as described in the '601 application.

A solution to the dark current problem is described in U.S. patent application Ser. No. 11/752,601, filed on May 23, 2007 by Levine et. al. (the "'601 application"), which is a continuation-in-part of the '583 patent, and is incorporated herein by reference in its entirety. Referring now to FIG. 6, which is reproduced from FIG. 7 of the '601 application, there is shown a desired net doping profile 172 for a back-illuminated imaging sensor fabricated on Silicon-on-Insulator (SOI) which is designed for the reduction of dark current. Unlike the doping profiles shown in FIGS. 3-5, the net doping profile of FIG. 6 has a peak 190 a predetermined distance from the interface 180 between the insulating (buried oxide) layer 165 and the seed layer 170 (inside the region 170). The doping level, which can be p-type or n-type, increases monotonically beginning at the interface 180 between the insulator layer 165 and the seed layer 170. The doping profile continues to increase monotonically in the region 185, known as the dead band, until reaching a peak 190 within the seed layer 170 before monotonically decreasing, shown by the curve 195 inside the regions 170, 175 corresponding to one or both of the seed layer 16 and the epitaxial layer 20 of FIG. 1. The desired net doping profile 172 can be approximately Gaussian in shape.

Both dark current electrons and signal electrons can be influenced by the dead band-generated electric field. Processing parameters and the range of wavelength of operation are chosen to allow signal electrons to pass the dead band peak 190 toward the front side imaging components 24 while preventing dark current electrons from penetrating this barrier. The potential barrier corresponding to the doping maximum 190 should be large enough to prevent thermionic emission of dark current from moving past the doping peak 190 into the regions 170, 175. To assure negligible thermionic emission of dark current electrons over the potential barrier peak 190, the barrier peak voltage level in a preferred embodiment is about 10 times greater than kT, but may range from about 3 to 30 times greater than kT, where k is the Botzmann constant and T is absolute temperature in Kelvins. For signal electrons to get past the barrier peak 190, the absorption depth of incident signal photons, which depends on their wavelength, needs to be greater than the distance of the peak 190 from the interface 180 between the seed layer 170 and the insulator layer 165.

The dead band can be created by ion-implantation method previously described in FIG. 1, or by custom doping during epitaxial growth on a seed layer 16. In FIG. 6, instead of growing a second oxide layer overlying the seed layer 170 and then performing ion implantation through the second oxide layer, the dead band profile 172 can be obtained by growing an epitaxial layer 175 directly on the seed layer 170 and varying the doping concentration appropriately, as can be appreciated by those skilled in the art.

The methods for manufacturing a back illuminated imager based on either of the '583 patent or the Levine et al. '601 application requires several cleaning steps, which may leave residue on the ultra thin silicon surface. Residue is undesirable because it can result in unwanted image artifacts. Accordingly, what would be desirable, but has not yet been provided, is a method for producing imagers with improved characteristics and fewer processing (e.g., cleaning) steps as compared to prior art devices.

SUMMARY OF THE INVENTION

The above-described problems are addressed and a technical solution achieved in the art by providing a method for fabricating a back-illuminated semiconductor imaging device on an UTSOI substrate. The UTSOI substrate is formed by providing a handle wafer comprising a mechanical substrate and an insulator layer substantially overlying the mechanical substrate; providing a donor wafer; implanting hydrogen in the donor wafer to form a bubble layer; doping with at least one dopant the donor wafer to form a seed layer proximal to the bubble layer; bonding the handle wafer and the donor wafer between the insulator layer of the handle wafer and a surface of the donor wafer proximal to the seed layer to form a combined wafer having a portion substantially underlying the bubble layer; and removing a portion of the combined wafer substantially underlying the bubble layer to expose the seed layer. The method may further comprise growing an epitaxial layer substantially overlying the seed layer, wherein at least one dopant diffuses into the epitaxial layer.

In one embodiment, at completion of the growing of the epitaxial layer, there exists a net dopant concentration profile which has an initial maximum value at an interface between the seed layer and the insulator layer and which decreases monotonically with increasing distance from the interface within at least a portion of at least one of the seed layer and the epitaxial layer. The net dopant concentration profile may have a slope which decreases monotonically at a first average rate within the semiconductor substrate, and decreases monotonically at a second average rate that is slower than the first average rate within the seed layer.

In another embodiment, at completion of the growing of the epitaxial layer there exists a net dopant concentration profile which has a maximum value at a predetermined distance from the interface between the insulator layer and the seed layer and which decreases monotonically on both sides of the profile from the maximum value within one of the seed layer and the epitaxial layer. The doping profile between the interface with the insulation layer and the peak of the doping profile functions as a "dead band" to prevent dark current carriers from penetrating to the front side of the device. The shape of the net dopant concentration profile is approximately Gaussian. The maximum value of the net dopant concentration profile may be set such that a potential barrier corresponding to the doping maximum is in the range of about 3 to 30 times greater than kT, where k is the Botzmann constant and T is absolute temperature in Kelvins. The net dopant concentration may have a peak about 1000 Angstroms away from the seed layer-insulator layer interface within the seed layer and epitaxial layer.

For both of the above embodiments, removing the portion of the combined wafer substantially underlying the bubble layer comprises cracking the bubble layer. The bubble layer may be located at a mean depth in the range of 1000 Angstroms to 2000 Angstroms. The method may further comprise the step of forming an insulator layer on the donor wafer before the step of implanting hydrogen in the donor wafer, wherein the step of bonding the handle wafer to the donor wafer further comprises the step of bonding the insulator layer of the handle wafer to a surface of the insulator layer on the donor wafer.

The epitaxial layer and the seed layer comprise silicon and the insulator layers comprise an oxide of silicon. The at least one dopant may be at least one of boron, phosphorous, antimony, arsenic, indium and gallium. The method may further comprise the step of fabricating at least one imaging component in the epitaxial layer. The at least one imaging component may be at least one of a CMOS imaging component, a charge-coupled device component, a photodiode, an avalanche photodiode, and a phototransistor.

The method may further comprise the step of removing at least a portion of the mechanical substrate such that a thickness of the remaining mechanical substrate functions as an anti-reflection coating for electromagnetic radiation. The method may further comprise the step of removing at least a portion of the insulator layer following complete removal of the mechanical substrate such that a thickness of the remaining insulator layer functions as an anti-reflection coating for electromagnetic radiation.

BRIEF DESCRIPTION OF THE DRAWINGS

The present invention may be more readily understood from the detailed description of an exemplary embodiment presented below considered in conjunction with the attached drawings and in which like reference numerals refer to similar elements and in which.

It is to be understood that the attached drawings are for purposes of illustrating the concepts of the invention and may not be to scale.

DETAILED DESCRIPTION OF THE INVENTION

Figure 7:
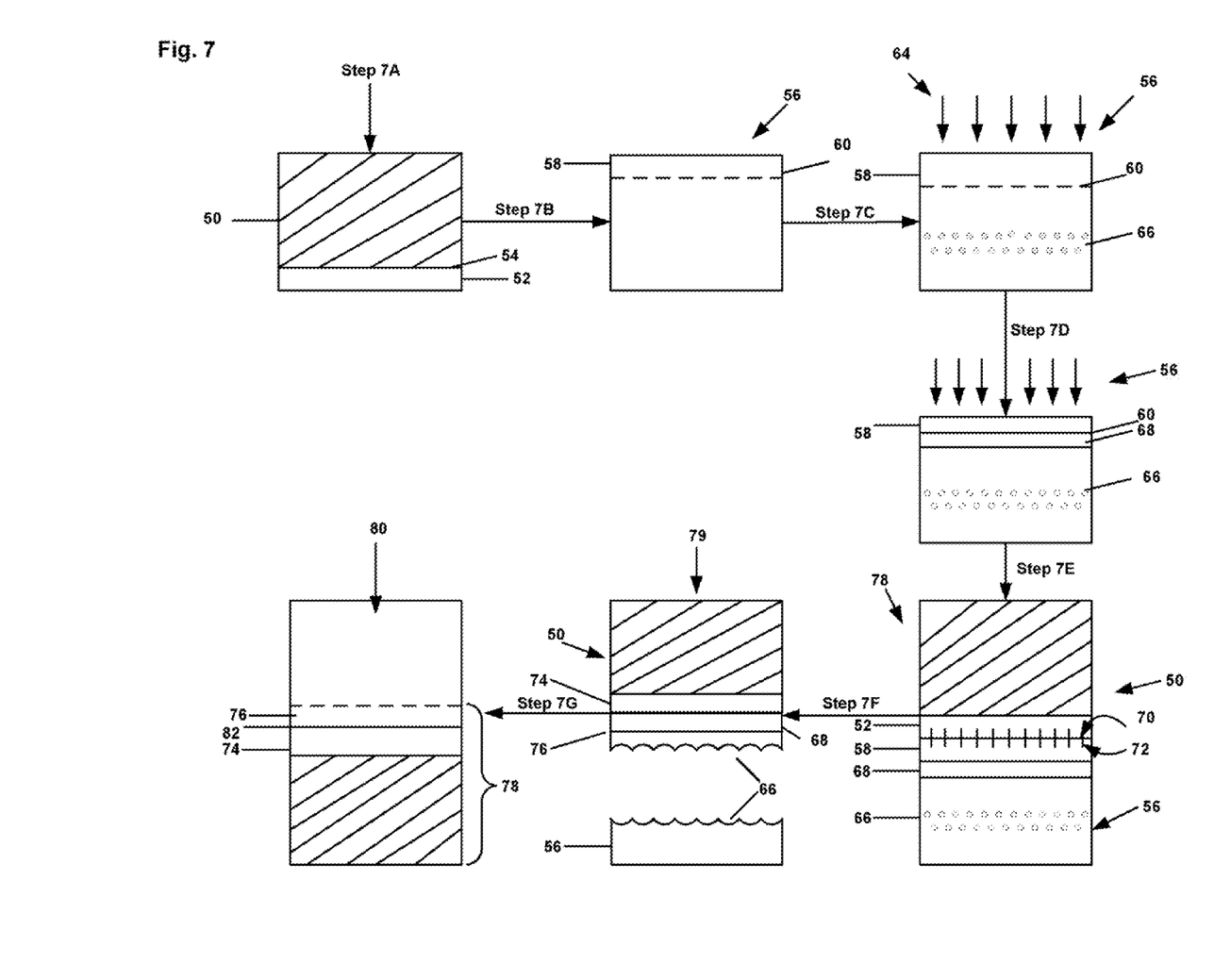
FIG. 7 is a block diagram illustrating the steps of manufacturing a back illuminated imager based on the "Smart Cut" method, constructed in accordance with an embodiment of the present invention.

The following embodiment of an illustrative method for manufacturing a back illuminated imager employs a method known in the art called the "Smart Cut" method. Referring now to FIG. 7, steps for manufacturing a back illuminated imager based on the "Smart Cut" method according to an embodiment of the present invention is depicted. In Step 7A, a handle wafer 50 (e.g., a silicon handle wafer) is cleaned and then an insulator layer 52 (e.g., a buried oxide layer of silicon (BOX)) is formed on a surface 54 of the handle wafer 50 to form a mechanical substrate 50 and the insulator layer 52, respectively. In Step 7B, a donor wafer 56 is provided and then an optional second insulator layer 58 (i.e., a second oxide layer of silicon) is formed overlying a surface 60 of the donor wafer 56.

In Step 7C, hydrogen 64 is implanted into the donor wafer 56 containing the optional second insulator layer 58. This implant creates a bubble layer 66 at a mean (predetermined) depth of the implant. This bubble layer 66 may be at a depth of about 1000 to 2000 Å but not limited to that range. In Step 7D, the donor wafer 56 may be doped (e.g., implanted) with at least one dopant to form a doped layer 68 proximal to the bubble layer 66, preferably between the second insulator layer 58 and the bubble layer 66. In some embodiments, the doped layer 68 may substantially overly the bubble layer 66. In other embodiments, some of the dopant may penetrate the bubble layer 66, such that the doped layer 68 may extend past the bubble layer 66. The dopant of the doped layer 68 and may be either p-type or n-type. Suitable dopants for use in the present embodiment include but are not limited to boron, phosphorous, antimony, arsenic, indium and gallium.

For a p-type donor wafer, the doped layer 68 may be, for example, boron implanted to a depth less than that of the fracture interface (i.e., in the region of the bubble layer 66). The implanted doped layer 68 may have a dose and energy adjusted to give a doping maximum at, or near (proximal to) the Si—SiO$_2$ interface 60. This may be achieved by doping the optional second insulator layer 58. According to an embodiment of the present invention, the initial net doping concentration of the doped layer 68 may be on the order of $10^{17}$ charge carriers per cubic centimeter or higher.

After the hydrogen and boron implants are completed, in Step 7E, the handle wafer 50 and the donor wafer 56 are bonded together at a surface 70 of the insulator layer 52 of the handle wafer 50 and the surface 72 proximal to the doped layer 68 (which may be the optional second insulator layer 58) of the donor wafer 56, resulting in a combined insulator layer 74 (BOX layer 74) of a combined wafer 78.

In Step 7F, the combined wafer 78 is "cracked" at the weakened bubble layer 66 and a major portion of the donor wafer 56 is removed while leaving a seed layer 76 (which contains the doped layer 68) bonded to the combined insulator layer 74 to form an ultra thin silicon-on-insulator (UTSOI) wafer 79. With the above described implant method of the present invention, this seed layer 76 already contains the doping profile required to achieve low back surface recombination and low point spread.

In Step 7G, an epitaxial layer 80 is grown substantially overlying the seed layer 76 of the UTSOI wafer 79, using the seed layer 76 as the template. The epitaxial layer 80 provides a layer for fabricating front side components to form the overall imaging device.

Still referring to FIG. 7, during the growth of epitaxial layer 80, dopants previously introduced into the seed layer 76 diffuse into epitaxial layer 80 as a result of processing at or above 1000° C. At the conclusion of the growth of the epitaxial layer 80, the net doping profile is very close to the desired profile, in that at each distance from the Si—SiO$_2$ interface 82 between the insulator layer 74 and the seed layer 76, within the seed layer 76 and epitaxial layer 80, the net carrier concentration is close to its final desired value. The shape of the profile may be adjusted by varying dose and energy of the implanted dopant of the seed layer 76.

To obtain a dead band, a relatively thick (about 1000 Å for the simulation example shown in FIG. 6) seed layer 76 is created. The insulator layer 58 is designed to have a thickness of about 1450 Å. The boron implant dose is set to about 6.0E+14 ions/cm$^2$ and the implantation energy is set to about 35 KeV. This results in a profile with the dead band as shown in FIG. 6. The peak of the profile is about 1000 Å away from the Si—SiO2 interface within the seed layer 76 and epitaxial layer 80.

In FIG. 7, the steps of fabricating one or more imaging components in the epitaxial layer, removing the mechanical substrate, creating optional anti-reflection layers/coatings, and adding a lamination layer are omitted from the diagrams but may be optionally employed.

It is to be understood that the exemplary embodiments are merely illustrative of the invention and that many variations of the above-described embodiments may be devised by one skilled in the art without departing from the scope of the invention. It is therefore intended that all such variations be included within the scope of the following claims and their equivalents.

What is claimed is:

1. A method for fabricating a semiconductor device, comprising the steps of:

providing a handle wafer comprising a mechanical substrate and an insulator layer substantially overlying the mechanical substrate;

providing a donor wafer having a surface;

implanting hydrogen in the donor wafer through the surface to form a bubble layer;

doping the donor wafer with at least one dopant through the surface to form a doped layer proximal to the bubble layer;

bonding the handle wafer to the donor wafer at the surface to form a combined wafer having a portion substantially underlying the bubble layer;

removing a portion of the combined wafer substantially underlying the bubble layer to expose a seed layer; and growing an epitaxial layer substantially overlying the seed layer, wherein at least one dopant diffuses into the epitaxial layer such that, at completion of the growing of the epitaxial layer, there exists a net dopant concentration profile in the seed layer and the epitaxial layer which has maximum value at an interface between the seed layer and the insulator layer and which decreases monotonically with increasing distance from the interface within at least a portion of at least one of the seed layer and the epitaxial layer, and wherein the net dopant concentration profile has a slope which decreases monotonically at a first average rate within at least of one of the seed layer and the epitaxial layer, and decreases monotonically at a second average rate that is slower than the first average rate within at least one of the seed layer and the epitaxial layer.

2. The method of claim 1, wherein the shape of the net dopant concentration profile is approximately Gaussian.

3. The method of claim 1, further comprising the step of setting the maximum value of the net dopant concentration profile such that a potential barrier corresponding to the doping maximum is in a range of about 3 to 30 times greater than kT, where k is the Boltzmann constant and T is absolute temperature in degrees Kelvin.

4. The method of claim 1, wherein the step of removing the portion of the combined wafer substantially underlying the bubble layer comprises the step of cracking the bubble layer.

5. The method of claim 1, wherein the bubble layer is located at a mean depth in the range of 1000 Angstroms to 2000 Angstroms.

6. The method of claim 1, wherein the epitaxial layer and seed layer both comprise silicon and the insulator layer comprises an oxide of silicon.

7. The method of claim 1, wherein the at least one dopant is at least one of boron, phosphorous, antimony, arsenic, indium and gallium.

8. The method of claim 1 further comprising the step of fabricating at least one imaging component in the epitaxial layer.

9. The method of claim 8, wherein the step of fabricating at least one imaging component includes the step of fabricating at least one of a CMOS imaging component, a charge-coupled device component, a photodiode, an avalanche photodiode, and a phototransistor.

10. A method for fabricating a semiconductor device, comprising the steps of:
providing a handle wafer comprising a mechanical substrate and an insulator layer substantially overlying the mechanical substrate;
providing a donor wafer having a surface having a bubble layer formed therein by the implantation of hydrogen through the surface, the donor wafer having been doped with at least one dopant through the surface to form a doped layer proximal to the bubble layer;
bonding the handle wafer to the donor wafer at the surface to form a combined wafer having a portion substantially underlying the bubble layer;
removing a portion of the combined wafer substantially underlying the bubble layer to expose a seed layer; and
growing an epitaxial layer substantially overlying the seed layer,
wherein least one dopant diffuses into the epitaxial layer such that, at completion of the growing of the epitaxial layer, there exists a net dopant concentration profile in the seed layer and the epitaxial layer which has a maximum value at a predetermined distance from an interface between the insulator layer and the seed layer and which decreases monotonically on both sides of the profile from the maximum value within at least a portion of at least one of the seed layer and the epitaxial layer, and
wherein the net dopant concentration profile has a slope which decreases monotonically with increasing distance from the maximum value distal to the interface within at least one of the seed layer and the epitaxial layer at a first average rate, and decreases monotonically with increasing distance from the maximum value distal to the interface within at least one of the seed layer and the epitaxial layer at a second average rate that is slower than the first average rate.

11. The method of claim 10, wherein the shape of the net dopant concentration profile is approximately Gaussian.

12. The method of claim 10, further comprising the step of setting the maximum value of the net dopant concentration profile such that a potential barrier corresponding to the doping maximum is in the range of about 3 to 30 times greater than kT, where k is the Boltzmann constant and T is absolute temperature in degrees Kelvin.

13. The method of claim 10, wherein the step of removing the portion of the combined wafer substantially underlying the bubble layer comprises the step of cracking the bubble layer.

14. The method of claim 10, wherein the bubble layer is located at a mean depth in the range of 1000 Angstroms to 2000 Angstroms.

15. The method of claim 1, further comprising the step of forming an insulator layer on the surface of the donor wafer, wherein said step of bonding the handle wafer to the donor wafer further comprises the step of bonding the insulator layer of the handle wafer to an exposed surface of the insulator layer on the donor wafer to form a combined insulator layer.

16. The method of claim 10, further comprising the step of forming an insulator layer on the on the surface of the donor wafer, wherein said step of bonding the handle wafer to the donor wafer further comprises the step of bonding the insulator layer of the handle wafer to an exposed surface of the insulator layer on the donor wafer to produce a combined insulator layer.

* * * * *